United States Patent [19]

Knight

[11] 4,147,561
[45] Apr. 3, 1979

[54] SOLAR ENERGY COLLECTOR

[76] Inventor: John R. Knight, 10, Milton Rd., Gayton, Northampton, England

[21] Appl. No.: 723,454

[22] Filed: Sep. 15, 1976

[30] Foreign Application Priority Data

Sep. 25, 1975 [GB] United Kingdom ............... 39306/75

[51] Int. Cl.² .......................... F24J 3/02; H01L 31/00
[52] U.S. Cl. .................................... 136/206; 126/270; 126/271; 136/89 PC
[58] Field of Search ................... 136/206, 89 PC, 214, 136/215; 126/270, 271; 250/203; 350/292

[56] References Cited

U.S. PATENT DOCUMENTS

| 3,058,394 | 10/1962 | Edlin | 126/270 |
| 3,991,741 | 11/1976 | Northrup, Jr. et al. | 126/271 |
| 4,022,186 | 5/1977 | Northrup, Jr. | 126/270 |
| 4,058,110 | 11/1977 | Holt | 126/271 |

Primary Examiner—Maynard R. Wilbur
Assistant Examiner—Lawrence Goodwin
Attorney, Agent, or Firm—William R. Liberman

[57] ABSTRACT

This invention provides a solar energy collector including a Fresnel lens substantially fixed in orientation and position relative to the Earth, a receiver situated at a focal point of the said Fresnel lens, a mounting mechanism which constrains the receiver to move along the focal surface of the Fresnel lens, and orientation means for continually orientating the receiver so that the said receiver remains in a region of high intensity of radiation during periods of direct sunlight.

The solar energy collector according to the invention is particularly suitable for inclusion in building structures.

16 Claims, 12 Drawing Figures

SOLAR ENERGY COLLECTOR

FIELD OF THE INVENTION

This invention relates to a solar energy collector.

DESCRIPTION OF THE PRIOR ART

It is known to use optically absorbent bodies for the collection of solar radiation which is then converted into heat, and to use semiconductor photovoltaic devices or thermoelectric devices for the collection of solar radiation which is then converted into electricity. Smaller and therefore cheaper collectors may be employed if the radiation is first intensified by means of an optical concentrator such as a lens, Fresnel lens or curved reflector. From considerations of cost and weight, it is particularly favourable to use a Fresnel lens. Intensification is important as photovoltaic and thermoelectric devices are at present too expensive to be used without intensifiers for commercial supply of electricity. However the collector, consisting of an optical concentrator with a receiver placed at or near its focus, then needs to be orientated to follow the apparent motion of the sun. In addition, only the direct component of solar radiation is utilised.

SUMMARY OF THE INVENTION

The present invention provides a solar energy collector incorporating an optical concentrator, which consists of a Fresnel lens substantially fixed in orientation and position relative to the Earth, a receiver situated at a focal point of the Fresnel lens, a mounting mechanism which constrains the receiver to move along the focal surface of the Fresnel lens and orientation means for continually orientating the receiver so that said receiver remains in a region of high intensity of radiation during periods of direct sunlight. By virtue of its mode of construction and operation, the solar energy collector according to the invention is particularly suitable for inclusion in building structures. In cases where the collector has to be mounted at an unsuitable angle relative to the incident sunlight a Fresnel prism may be incorporated to direct the light onto the collector.

The term Fresnel lens includes both spherical (punctual) and cylindrical (linear) Fresnel lens.

The receiver may take any of a variety of forms. It may comprise a body which absorbs solar radiation and gives thermal output, for example by heating flowing water, or may include on its front surface a photovoltaic device, particularly a silicon photovoltaic device, or a thermoelectric device providing an electrical output.

BRIEF DESCRIPTION OF THE DRAWINGS

The foregoing and other features according to the invention will be better understood from the following description with reference to FIGS. 1 to 6 of the accompanying drawings in which.

DESCRIPTION OF THE PREFERRED EMBODIMENTS

Figure 1:
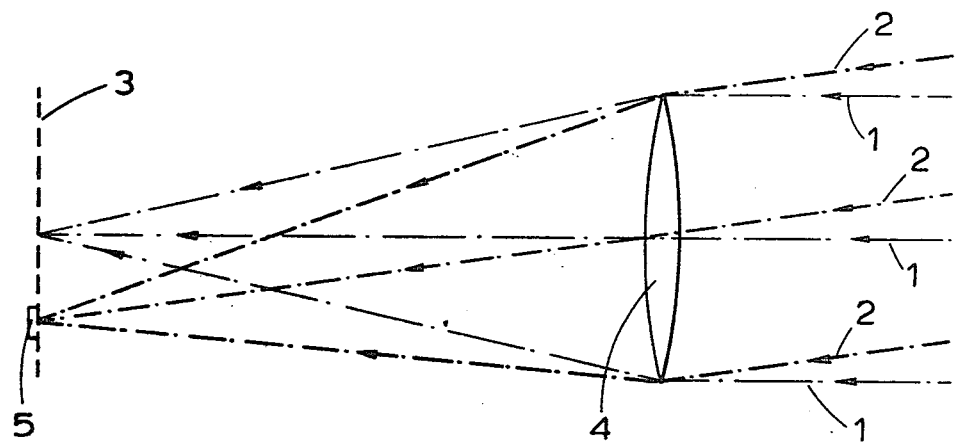
FIG. 1 illustrates, in section, the refraction of normal and oblique rays by a simple lens.

In FIG. 1 normal rays 1 and oblique rays 2 are focussed on the focal plane or surface 3 of a simple convex lens 4. Direct solar radiation could be collected by providing a receiver 5 which moves across the focal surface 3 of the lens 4 to follow the apparent motion of the sun.

Figure 2:
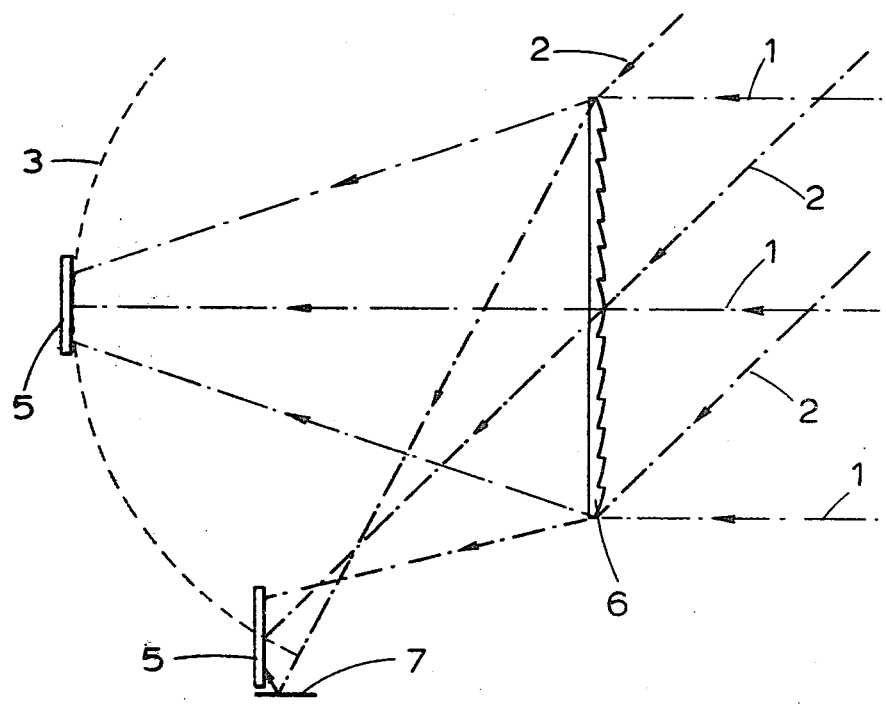
FIG. 2 illustrates in section, the refraction of normal and oblique rays by a Fresnel lens.

The refraction by a Fresnel lens 6, of both normal rays 1 and oblique rays 2 having a mis-orientation angle of 45° is illustrated in FIG. 2. The degradation of focus increases with the aperture of the lens and with the angle of mis-orientation and is seen to be severe in the example illustrated. However the aim is not to provide an image of optical quality, but to achieve maximum collection of radiation with a receiver of small size. Good results are obtained if the receiver 5 is situated upon a spherical focal surface 3, illustrated as a broken line. When considering the optimum position of the receiver 5, one should remember that the illustration represents a section through the optical system, and that rays above and below the plane of the paper also have to be taken into account. For best results, the grooved face of the Fresnel lens 6 should face the incident solar radiation. Improved collection of radiation can be achieved by providing a small reflector 7 in the position indicated. However a cylindrical reflector attached to the receiver cannot be used as it interferes with rays approaching the receiver from other directions. A somewhat larger substantially cylindrical reflector, asymmetrically positioned with respect to the receiver provides a significant improvement in the collection of oblique radiation.

Figure 3:
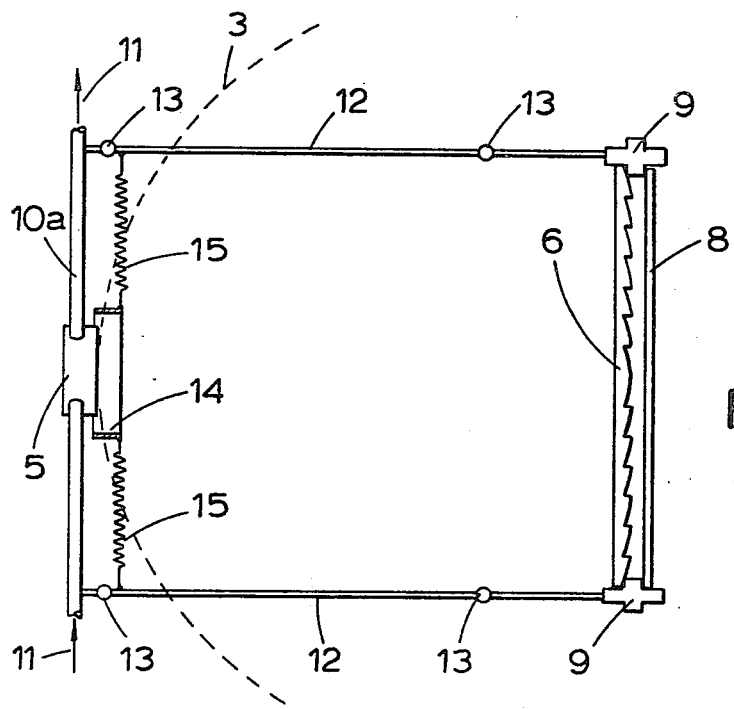
FIG. 3 illustrates in plan view a method of mounting the receiver and reflector for maximum light collection.

An embodiment of a solar energy collector according to the invention is illustrated in FIG. 3. The Fresnel lens 6 and a sheet of glass 8 are supported by glazing bars 9. The glass 8 protects the grooved face of the Fresnel lens 6 from dirt, ultra-violet radiation and other atmospheric agents. The receiver and mechanism of the solar energy collector are protected from atmospheric agents by a cover, or by virtue of being situated within a building structure. The receiver 5 is attached to four tubular supports 10a which also serve to convey cooling water 11 through the receiver. These tubular supports 10a are attached to four linkage rods 12 each embodying two universal joints 13, which in turn are attached to the glazing bars 9. By this mechanism, the receiver is constrained to move on a spherical surface 3 whilst at the same time remaining parallel to the Fresnel lens 6. A hollow substantially cylindrical body 14, reflective on its inner surface is flexibly attached to the linkage rods 12 by means of four springs 15, so that the desired asymmetrical positioning is achieved automatically. Several solar energy collectors according to the invention may be joined together to form an array with resulting economy in construction.

Figure 7:
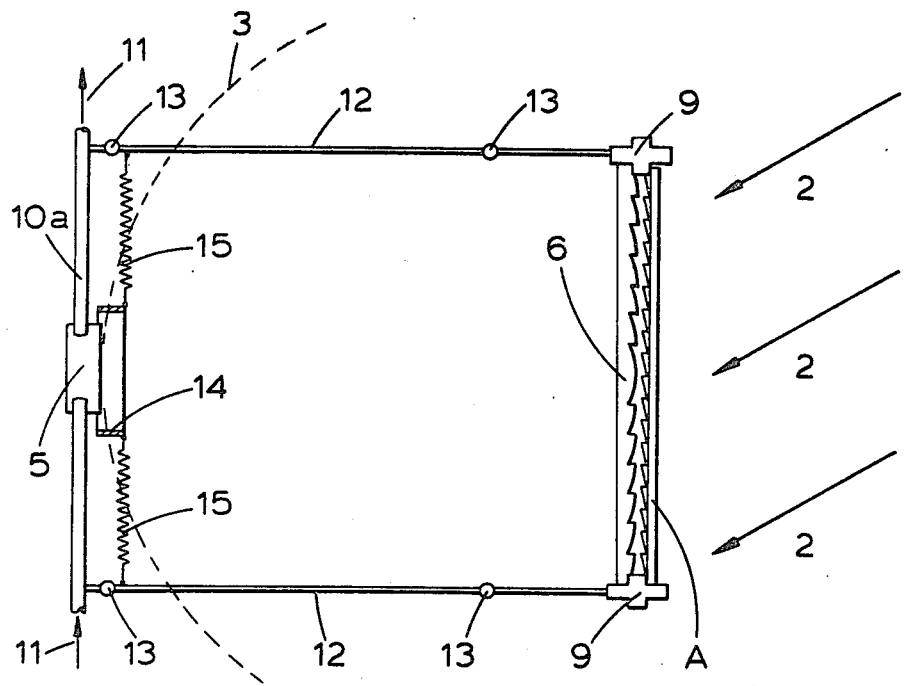
FIG. 7 illustrates, in side view, a solar collector incorporating a Fresnel prism.

In FIG. 7, the sheet of glass 8, is substituted for by a Fresnel prism A.

Figure 8:
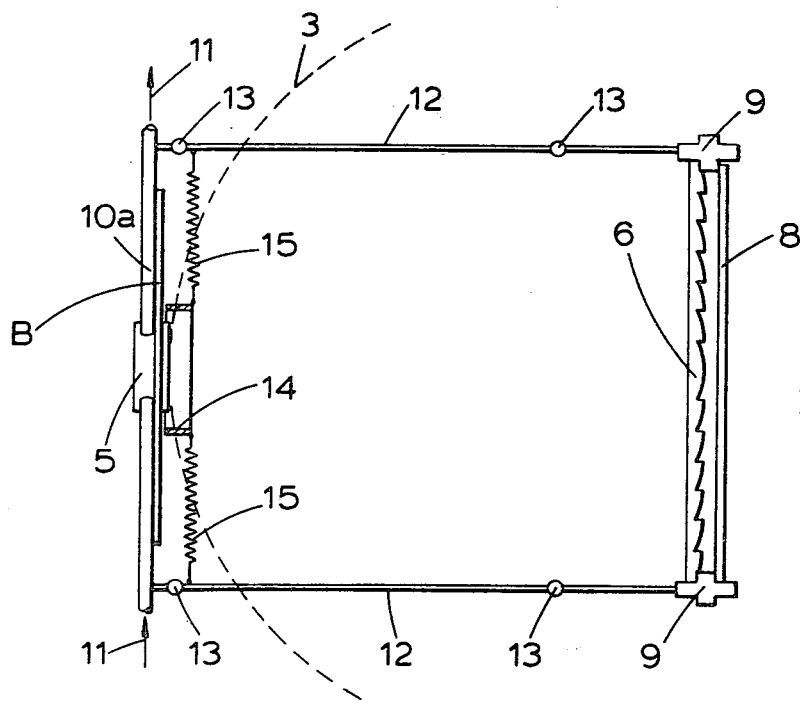
FIG. 8 illustrates, in plan or side-view, a solar energy collector incorporating photoelectric cells for orientation purposes.
Figure 9:
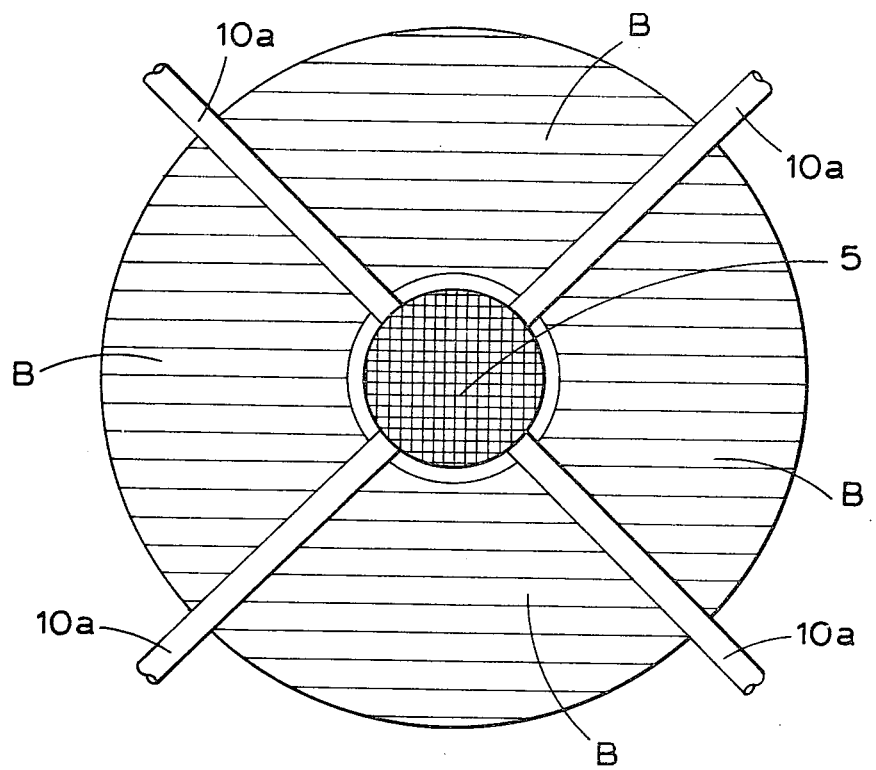
FIG. 9 illustrates, in close front view, two pairs of photoelectric cells acting as optical sensors.
Figure 10:
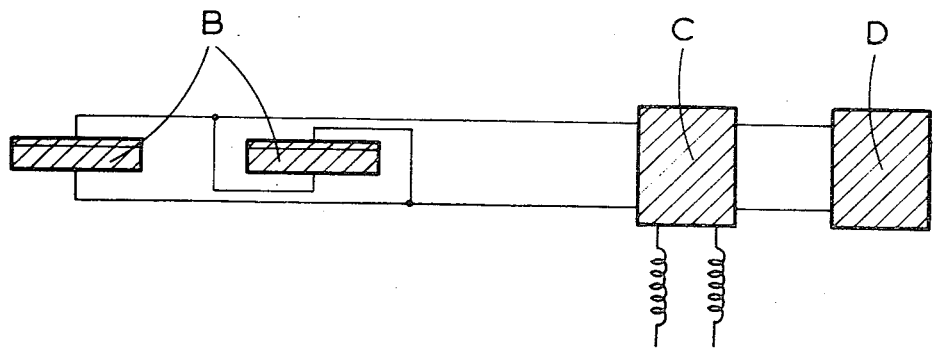
FIG. 10 illustrates a servo motor circuit.

A means of orientation is provided to adjust the position of the receiver or array of receivers, to follow the apparent motion of the sun. The position of the receiver needs to be such that its centre, the centre of the Fresnel lens and the sun need to lie in a straight line. The orientation means may be for example of the sun-seeking type, as shown in FIGS. 8-10, incorporating photoelectric cells, amplifiers and servo motors. Two pairs of photoelectric cells B are mounted substantially parallel to a line joining the center of the Fresnel lens to the center of the receiver 5. The outputs of each pair of the cells B are connected to an amplifier C, which is in turn connected to a servo motor D. Alternatively, since the the apparent motion of the sun is known, the orientation means may be of the programmed type.

Figure 11:
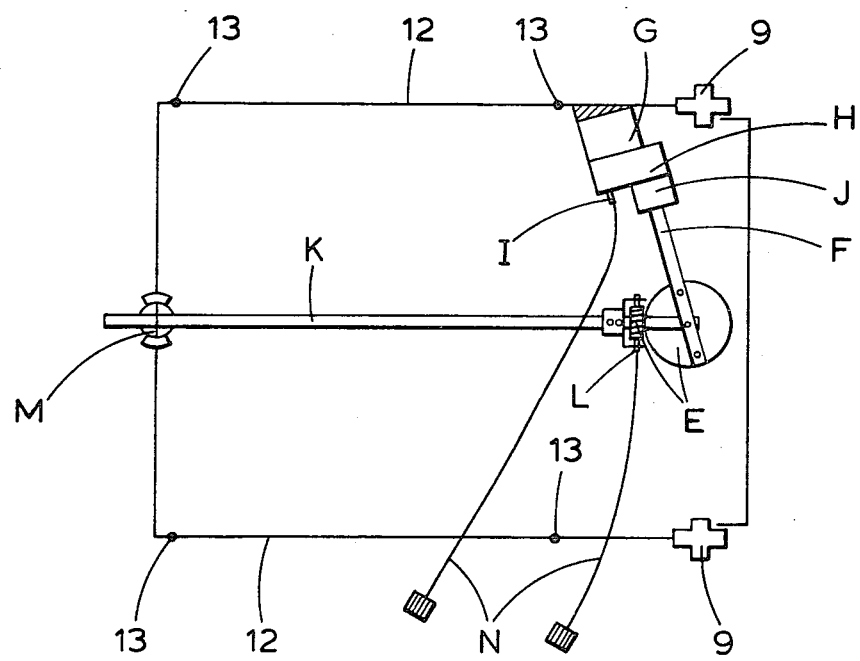
FIG. 11 illustrates, in side view, the layout of a programmed orientation means.

In a preferred programmed type of orientation, one position near the centre of an array is left vacant and is used for accommodating the orientation mechanism as shown in FIG. 11. This mechanism includes a spindle F mounted parallel to the earth's polar axis, and driven at 15 degrees/hour, a constant angular velocity, by driving means G-H. Where the spindle F intersects the plane of the Fresnel lenses, an adjustable driving arm K is attached. By means of two hand-operated adjusting movements N-I and N-E-L, this driving arm is brought into line with the direct rays of the sun. One of these adjusting movements N-E-L needs to be operated from time-to-time to accommodate the sun's seasonal variation of elevation. There is also provided a spring-loaded trip mechanism J so that when the driving arm K reaches to end of its travel, it disengages from the driving shaft and returns to a position ready for re-engagement the following morning. The driving arm passes through a hollow ball joint M mounted at the appropriate point in the plane of the receiver array, and thereby maintains the receiver array in the correct orientation.

Figure 4A:
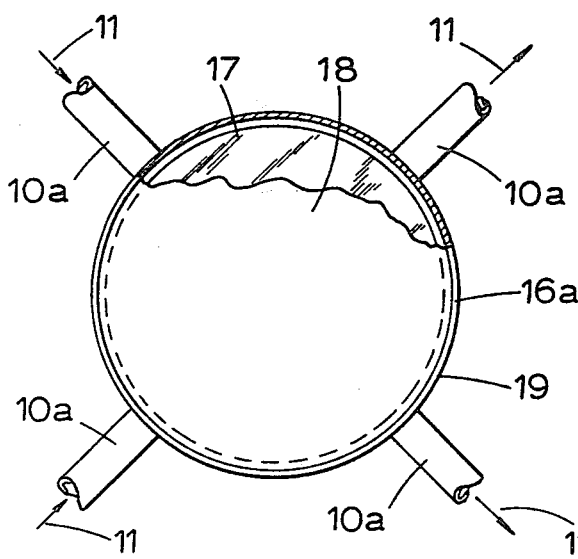
FIGS. 4A and 4B illustrate, in front view and partial plan and partial sectional view respectively, a receiver which provides thermal and electrical outputs.
Figure 4B:
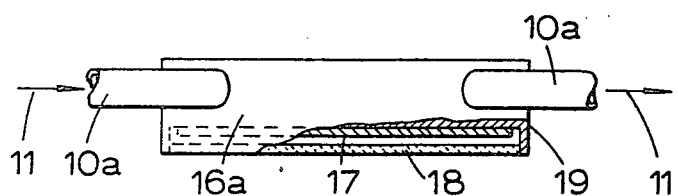

The receiver can take a variety of forms, one of which is illustrated in FIGS. 4A and 4B. The receiver body 16a consists of a hollow cylinder cooled by means of water conveyed through the four tubular supports 10a. A photovoltaic device 17 is mounted in a recess in the front surface of the receiver body 16a and protected by a transparent window 18. The outer cylindrical surface 19 of the receiver body 16a is blackened to increase absorption of stray radiation which is not intercepted by the photovoltaic device 17. Thermal output of the receiver serves to raise the temperature of the cooling water 11, and electrical outpuut is conveyed from the photovoltaic device 17 to the external circuit via electrical leads which are not illustrated. Loss of heat can be reduced by thermally insulating some parts of the cooling water system.

Figure 5:
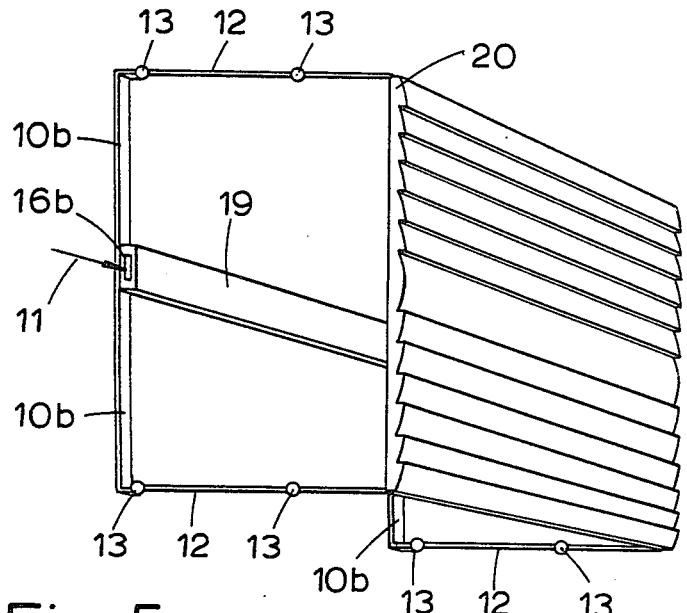
FIG. 5 illustrates in pictorial view a solar energy collector which incorporates a cylindrical Fresnel lens.

The Fresnel lens 6 can be replaced by a cylindrical Fresnel lens 20 as in FIG. 5. The supporting glazing bars and protective sheet of glass are not shown in this figure.

Movement of the receiver is again constrained by linkage rods 12 each embodying two universal joints 13. In this variation of the solar energy collector cooling water 11 flows along the receiver body 16b and the supports 10b need therefore not be of tubular construction. No photovoltaic device or protective transparent window is shown in the illustration. However it should be understood that at least one photovoltaic or thermoelectric device could be mounted upon the illuminated face 19 of the receiver body 16b. Although not shown in the illustration two strip reflectors attached via springs to the linkage rods may be added to increase the collection of oblique solar radiation. These reflectors are analogous in function to the cylindrical reflector used in conjunction with the Fresnel lens.

Figure 6:
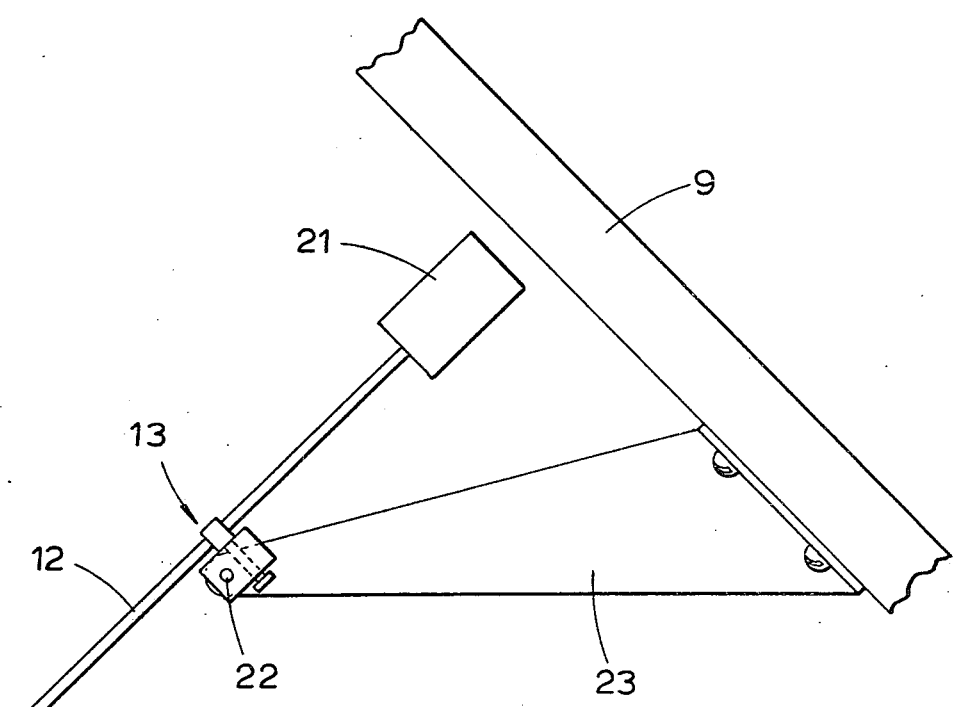
FIG. 6 illustrates in side view, details of a support bracket, universal joint and counterbalance weight.

In FIG. 6 are illustrated balancing weights 21 for balancing the weight of the receiver array, and also means (coupling rod 22 and bracket 23) for preventing the receiver array twisting relative to the array of Fresnel lenses. To prevent any twisting action, the universal joints 13 in at least one row each permit rotation about two axes at right angles, rotation about one of those axes being coupled by means of a coupling rod extending along that row.

A small solar energy collector incorporating a fixed Fresnel lens 21 cm high, 14 cm wide, focal length 21 cm, together with a movable 3 cm diameter receiver achieved satisfactory collection of solar radiation for vertical mis-orientation up to 25° and horizontal misorientation up to 45° or a combination of both. That collector could be scaled up as required.

It should be understood that the scope of the solar energy collector according to the invention is not limited to that of supplying heat and/or electricity. For example an array of such collectors mounted in a roof structure would admit diffuse sunlight which is rich in short wavelength visible radiation, but intercept direct sunlight which is rich in longer wavelength visible and infra-red radiation. Thus the building would be illuminated sufficiently for normal working or for photosynthesis, whereas overheating would be avoided by transferring heat from the receivers to the outside of the building. All visible radiation within the building would be diffuse, thereby on the one hand improving working conditions, or on the other hand improving conditions for photosynthesis. If desired the receivers could be transparent to visible radiation but opaque to infra-red in order to provide a higher degree of illumination without overheating.

I claim:

1. A solar energy collector including Fresnel lens substantially fixed in orientation and position relative to the Earth, a mounting mechanism capable of movement relative to the Fresnel lens, a receiver supported by the mounting mechanism, the mounting mechanism moving the receiver about an area defined as the surface of a sphere, which area defines the focal surface of the Fresnel lens for direct sunlight, and orientation means for continually orientating the receiver so that said receiver is positioned in a region of high intensity of radiation during the period of direct sunlight.

2. A solar energy collector according to claim 1 wherein the Fresnel lens is a linear Fresnel lens.

3. A solar energy collector according to claim 1 wherein the Fresnel lens is protected from degradation by atmospheric agents by at least one sheet of transparent material.

4. A solar energy collector according to claim 3 in which the protective material incorporates a Fresnel prism.

5. A solar energy collector according to claim 1 wherein the receiver is provided with a means of heat removal.

6. A solar energy collector according to claim 1 wherein the receiver is provided with a black or other absorbent surface to enhance the absorption of solar radiation.

7. A solar energy collector according to claim 1 wherein the receiver includes at least one photovoltaic device for generating an electrical output.

8. A solar energy collector according to claim 7 wherein the photovoltaic device is a silicon photovoltaic device.

9. A solar energy collector according to claim 1 wherein the receiver includes at least one thermoelectric device for generating an electrical output.

10. A solar energy collector according to claim 1 wherein the receiver, when in its operative state, has the property of selective transmission of radiation of different wavelengths.

11. A solar energy collector according to claim 1 wherein the receiver includes a transparent window, capable of protecting any part of the said receiver.

12. A solar energy collector according to claim 1 wherein the orientation means consists of a direction sensor mounted substantially parallel to a line joining the centre of the Fresnel lens to the centre of the receiver.

13. A solar energy collector according to claim 12 wherein the direction sensor includes two pairs of photovoltaic devices whose outputs are amplified and control the orientation of the receiver by means of two servo motors.

14. A solar energy collector according to claim 1 wherein the orientation means comprises a mechanism to permit a periodic adjustment to suit the seasonal variation in the sun's altitude, and a constant angular velocity mechanism to follow the sun's daily apparent motion.

15. A solar energy collector according to claim 1, comprising at least two collectors joined together to form an array, wherein the array of receivers is orientated by a single orientation means, each receiver being mounted on the Fresnel lens by means of linking rods provided with two universal joints, the array of collectors being so joined to the Fresnel lens that the respective rods and joints of the collectors form rows, the universal joints in at least one row permitting rotation about two axes at right angles, a coupling rod extending along the row of universal joints, coupling the universal joints together so as to prevent twisting of the receiver array relative to the array of Fresnel lenses.

16. A solar energy collector according to claim 1, comprising in addition at least one reflecting surface operatively adjacent to the receiver, the reflecting surface being designed and adapted to direct onto the receiver radiation which would otherwise not be intercepted by the receiver.

* * * * *